United States Patent
Loiferman et al.

(10) Patent No.: US 10,084,727 B2
(45) Date of Patent: *Sep. 25, 2018

(54) CABLE BACKPLANE

(71) Applicant: MELLANOX TECHNOLOGIES LTD., Yokneam (IL)

(72) Inventors: Igor Loiferman, Yokneam Illit (IL); Avi Gibbs, Rehovot (IL); Samer Khoury, Nazareth Illit (IL)

(73) Assignee: Mellanox Technologies, Ltd., Yokneam (IL)

( * ) Notice: Subject to any disclaimer, the term of this patent is extended or adjusted under 35 U.S.C. 154(b) by 0 days.

This patent is subject to a terminal disclaimer.

(21) Appl. No.: 15/350,127

(22) Filed: Nov. 14, 2016

(65) Prior Publication Data
US 2017/0063730 A1     Mar. 2, 2017

Related U.S. Application Data

(63) Continuation of application No. 14/445,079, filed on Jul. 29, 2014, now Pat. No. 9,531,645.

(51) Int. Cl.
*H04L 12/947* (2013.01)
*H04L 12/931* (2013.01)
(Continued)

(52) U.S. Cl.
CPC .......... *H04L 49/40* (2013.01); *H02B 1/202* (2013.01); *H04L 49/25* (2013.01); *H05K 7/1451* (2013.01);
(Continued)

(58) Field of Classification Search
CPC ..... H04L 41/0803; H04L 41/12; H04L 49/25; G06F 11/1423; G06F 11/2005
See application file for complete search history.

(56) References Cited

U.S. PATENT DOCUMENTS 3,855,427 A * 12/1974 Sinden ............... H04Q 1/14
                                                              361/827
4,732,446 A    3/1988 Gipson et al.
(Continued)

OTHER PUBLICATIONS

Custom Interconnects LLC, "Fuzz Buttons", 2 pages, Oct. 18, 2016.
(Continued)

*Primary Examiner* — James Wu
*Assistant Examiner* — Michael Matey
(74) *Attorney, Agent, or Firm* — D. Kligler IP Services Ltd.

(57) ABSTRACT

A main unit of a director-class switch including a wire-based backplane located in a chassis, having a plurality of slots configured to receive switch boards. The wire-based backplane includes a plurality of harnesses each including first and second cartridges, a plurality of interface port units mounted on each of the first and second cartridges and cables connecting each of the interface port units of the first cartridge to each of the interface port units of the second cartridge. The harnesses are mounted in the chassis such that the interface port units face ends of the slots in a manner configured to mate with corresponding connectors of switch boards inserted into the slots. A plurality of interface port units are mounted in each slot. Each cartridge includes interface port units which are located in a plurality of different slots.

19 Claims, 9 Drawing Sheets

(51) Int. Cl.
  *H02B 1/20* (2006.01)
  *H05K 7/14* (2006.01)
  *H05K 7/18* (2006.01)
  *G06F 11/20* (2006.01)
  *H04Q 1/14* (2006.01)

(52) U.S. Cl.
  CPC ........... *H05K 7/1457* (2013.01); *H05K 7/186* (2013.01); *G06F 11/2005* (2013.01); *H04Q 1/14* (2013.01)

(56) References Cited

U.S. PATENT DOCUMENTS

| | | | |
|---|---|---|---|
| 5,054,870 | A | 10/1991 | Losch et al. |
| 5,184,961 | A | 2/1993 | Ramirez et al. |
| 5,199,087 | A | 3/1993 | Frazier |
| 5,475,778 | A | 12/1995 | Webb |
| 5,535,036 | A | 7/1996 | Grant |
| 5,692,910 | A | 12/1997 | Mittal |
| 6,215,654 | B1 * | 4/2001 | Wilkie, II .............. H02B 1/202 218/156 |
| 6,343,171 | B1 | 1/2002 | Yoshimura et al. |
| 6,385,361 | B1 | 5/2002 | Corr |
| 6,393,183 | B1 | 5/2002 | Worley et al. |
| 6,399,964 | B1 | 6/2002 | Corr |
| 6,512,861 | B2 | 1/2003 | Charkavorty et al. |
| 6,574,687 | B1 * | 6/2003 | Teachout .............. G06F 3/0614 710/38 |
| 6,611,635 | B1 | 8/2003 | Yoshimura et al. |
| 6,684,007 | B2 | 1/2004 | Yoshimura et al. |
| 6,690,845 | B1 | 2/2004 | Yoshimura et al. |
| 6,706,546 | B2 | 3/2004 | Yoshimura et al. |
| 6,713,755 | B1 | 3/2004 | Iwasa |
| 6,821,029 | B1 | 11/2004 | Grung et al. |
| 6,845,184 | B1 | 1/2005 | Yoshimura et al. |
| 6,945,712 | B1 | 9/2005 | Conn |
| 7,200,295 | B2 | 4/2007 | Rolston et al. |
| 7,362,941 | B2 * | 4/2008 | Rinderer ................ H05K 7/186 385/134 |
| 7,510,421 | B2 * | 3/2009 | Fransen ............... H01R 9/2416 439/449 |
| 7,539,376 | B2 | 5/2009 | Bozso et al. |
| 7,698,491 | B1 * | 4/2010 | King, Jr. ............... G06F 13/409 174/50 |
| 7,729,581 | B2 | 6/2010 | Rolston et al. |
| 7,974,105 | B2 * | 7/2011 | Dean, Jr. ............... H04Q 1/062 361/826 |
| 7,983,194 | B1 | 7/2011 | Genetti et al. |
| 8,060,682 | B1 * | 11/2011 | Genetti ............... G06F 13/4022 370/400 |
| 8,068,351 | B2 * | 11/2011 | Figueroa ................. H02G 3/30 361/788 |
| 8,259,450 | B2 | 9/2012 | Dunwoody et al. |
| 8,270,830 | B2 | 9/2012 | Kirkpatrick et al. |
| 8,371,860 | B2 | 2/2013 | Xiang et al. |
| 8,410,364 | B2 | 4/2013 | Dunwoody et al. |
| 8,411,465 | B2 * | 4/2013 | Dean, Jr. ................ H04Q 1/062 361/825 |
| 8,441,793 | B2 | 5/2013 | Dunwoody et al. |
| 8,452,140 | B2 | 5/2013 | Yeh et al. |
| 8,588,561 | B2 | 11/2013 | Zbinden et al. |
| 8,588,562 | B2 | 11/2013 | Zbinden et al. |
| 8,749,986 | B1 | 6/2014 | Peterson et al. |
| 8,787,711 | B2 | 7/2014 | Zbinden et al. |
| 8,905,632 | B2 | 12/2014 | Shastri et al. |
| 9,002,155 | B2 | 4/2015 | Li et al. |
| 9,031,107 | B2 | 5/2015 | Shastri et al. |
| 9,374,165 | B2 | 6/2016 | Zbinden et al. |
| 9,423,578 | B2 | 8/2016 | Lai et al. |
| 9,554,461 | B2 | 1/2017 | Kato |
| 9,584,373 | B2 | 2/2017 | Schlansker et al. |
| 9,697,160 | B2 | 7/2017 | Genetti et al. |
| 2002/0018339 | A1 * | 2/2002 | Uzuka ..................... G06F 1/184 361/796 |
| 2005/0191003 | A1 | 9/2005 | Yorks et al. |
| 2006/0013207 | A1 * | 1/2006 | McMillen ................. G01J 3/06 370/388 |
| 2007/0294520 | A1 * | 12/2007 | Leigh ..................... G06F 9/4411 713/1 |
| 2008/0062655 | A1 * | 3/2008 | Laursen ................... H04Q 1/09 361/733 |
| 2008/0222351 | A1 | 9/2008 | Verdiell et al. |
| 2010/0254652 | A1 * | 10/2010 | Kirkpatrick ........ H04Q 11/0005 385/17 |
| 2013/0028256 | A1 * | 1/2013 | Koren ................... H04L 47/122 370/392 |
| 2014/0259650 | A1 * | 9/2014 | Carter ................. G09B 23/182 29/825 |
| 2015/0351233 | A1 | 12/2015 | Peterson et al. |

OTHER PUBLICATIONS

Amphenol TCS, "TB-2324—General Product Specification for Paladin TM Interconnect Systems", Revision "F", 11 pages, 2017.
U.S. Appl. No. 15/582,705 office action dated Oct. 20, 2017.

* cited by examiner

CABLE BACKPLANE

CROSS-REFERENCE TO RELATED APPLICATION

This application is a continuation of U.S. patent application Ser. No. 14/445,079 filed Jul. 29, 2014.

FIELD OF THE INVENTION

The present invention relates generally to communication switches, and specifically to switch backplanes.

BACKGROUND OF THE INVENTION

With the advance of computer networking, there is a need to connect larger numbers of computing devices. Switches are normally used to connect computing devices, and when a large number of computing devices need to be connected to each other, large switches are utilized.

Director-class switches are used at the center of very large switched fabrics. Such director-class switches are formed of a large number of leaf boards which include ports for connecting to external equipment and spine boards which connect the leaf boards to each other within the director-class switch. In the prior art, director-class switches include a printed circuit board (PCB) backplane connecting the leaf and spine boards.

It is desirable to increase the number of ports serviced by a director-class switch. The manufacture of large switches which interconnect hundreds of ports, such that each port is connected to a large group of the other ports, is, however, a demanding task.

US patent publication 2014/0056174 to Walden et al., the disclosure of which is incorporated herein by reference in its entirety, describes connecting intelligent service modules external to a director-level switch, in order to avoid consuming the limited number of ports in a director-level switch.

U.S. Pat. No. 6,504,841 to Larson et al., the disclosure of which is incorporated herein by reference in its entirety, describes a scalable computer interconnect using flexible ribbon cable connection.

U.S. Pat. No. 7,706,361 to McMillen et al., the disclosure of which is incorporated herein by reference in its entirety, describes a multistage interconnect network in which signal wires are grouped into multiconductor cables to minimize the number of handled cables.

SUMMARY OF THE INVENTION

Embodiments of the present invention that are described hereinbelow provide a director-class switch, in which the backplane is formed from wires grouped together in bundles.

There is therefore provided in accordance with an embodiment of the present invention a main unit of a director-class switch, comprising a chassis, a plurality of slots on the chassis configured to receive switch boards; and a plurality of harnesses comprising first and second cartridges, a plurality of interface port units mounted on each of the first and second cartridges and cables connecting each of the interface port units of the first cartridge to each of the interface port units of the second cartridge. The harnesses are mounted in the chassis such that the interface port units face ends of the slots in a manner configured to mate with corresponding connectors of switch boards inserted into the slots. A plurality of interface port units are mounted in each slot, and each cartridge includes interface port units which are located in a plurality of different slots.

Optionally, the plurality of slots are located on first and second opposite walls of the chassis.

Optionally, the slots located on the first wall are configured to receive boards of a single type.

Optionally, the slots located on the first wall are configured to receive a different type of boards from the slots located on the second wall. Optionally, the first and second opposite walls of the chassis are connected by screws located in holes at least 50% larger than the cross-sections of the screws.

Optionally, each slot includes a plurality of interface port units of different harnesses.

Optionally, the plurality of harnesses include harnesses having different cables of different lengths allowing for different maximal distances between the cartridges of the harness.

The main unit optionally includes a printed circuit board serving as a connection between a power source of the director-class switch and power sockets in each of the slots.

Optionally, the main unit includes power cables connecting a power source of the director-class switch to power sockets in each of the slots.

There is further provided in accordance with an embodiment of the present invention, a method of constructing a main unit of a director-class switch, including providing a chassis including a plurality of slots on the chassis configured to receive switch boards, providing a plurality of harnesses including first and second cartridges, a plurality of interface port units mounted on each of the first and second cartridges; and cables connecting each of the interface port units of the first cartridge to each of the interface port units of the second cartridge, mounting the harnesses in the chassis such that the interface port units face ends of the slots in a manner configured to mate with corresponding connectors of switch boards inserted into the slots, a plurality of interface port units are mounted in each slot, and each cartridge includes interface port units which are located in a plurality of different slots.

Optionally, providing the chassis comprises providing a chassis with walls connected to each other in a manner allowing limited relative movement.

Optionally, the method includes strengthening a connection between the walls, limiting the possibility of relative movement of the walls, after mounting the harnesses in the chassis.

Optionally, the plurality of harnesses includes harnesses having different cables of different lengths allowing for different maximal distances between the cartridges of the harness.

Optionally, the harnesses all include the same number of interface port units. Optionally, each of the cartridges of the harnesses comprises at least four interface port units.

The present invention will be more fully understood from the following detailed description of the embodiments thereof, taken together with the drawings in which:

DETAILED DESCRIPTION OF EMBODIMENTS

Embodiments of the present invention relate to a director-class switch having sub-switches connected to each other through a cable based backplane. The sub-switches belong to two sets, and the cable based backplane connects each sub-switch of one set to all the sub-switches of the other set. The cables of the backplane are grouped into groups of cables connecting multi-sub-switch cartridges, such that the number of connections that need to be connected to form the backplane is on the order of the number of cartridges rather than the number of cables. This reduces the amount of work required to form the backplane and simplifies maintenance and part replacement of the backplane, when necessary.

Optionally, the director-class switch also includes power cables which connect power sockets of boards on which the sub-switches are mounted to a central power supply of the director-class switch. Alternatively or additionally, the director-class switch includes a cable-based control backplane which distributes control signals from a central controller of the switch to control sockets of the boards. The use of cables for the distribution of power and/or control signals, although a PCB could be used, allows for more flexibility in the arrangement of the boards in the switch chassis and thus reduces the extent of mechanical constraints on the connection of the cartridges to the boards. In some embodiments, the backplane uses cables for all connections and no PCBs are used to connect different boards in the chassis. In addition, the use of separate cables for providing power to the boards, separates the electric supply in a manner that reduces the chances that a short in one board will affect other boards.

An aspect of some embodiments of the invention relates to a multi-face director-class switch, including a plurality of slots for accepting switch boards, mounted on a plurality of faces of a backplane cage of the director-class switch. The backplane cage is constructed with some leeway between at least two of the faces of the cage, which carry switch boards. Accordingly, mechanical constraints induced by inserting switch boards into slots of a first face of the cage, do not induce substantial constraints on slots of a second face.

System Overview

Figure 1:
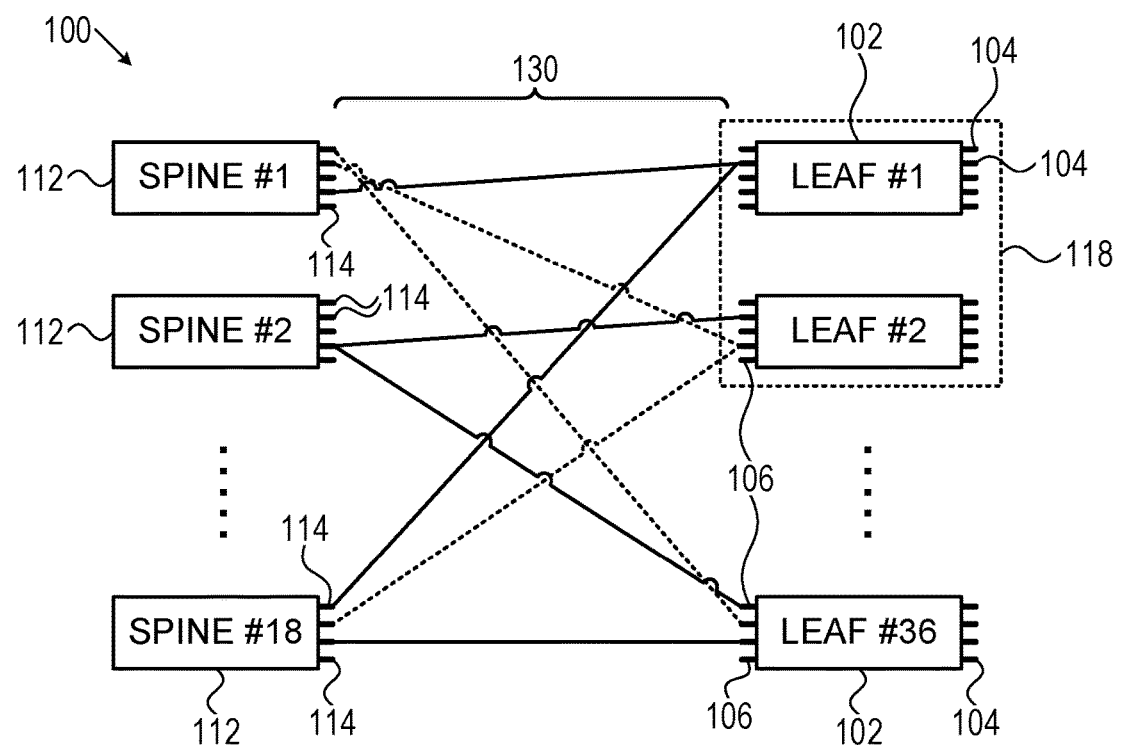
FIG. 1 is a block diagram of a director-class switch, in accordance with an embodiment of the present invention.

FIG. 1 is a block diagram of a director-class switch 100, in accordance with an embodiment of the present invention. Director-class switch 100 comprises a plurality of leaf switches 102, which each connects a plurality of external ports 104 to each other and to one or more internal ports 106. External ports 104 are adapted for connection to external devices (not shown), such as servers, computers, switches and/or storage units. Generally, the leaf switches 102 are mounted in pairs on respective leaf boards 118, although in some embodiments each leaf board carries only a single leaf switch, and in other embodiments three or more leaf switches 102 are mounted on each leaf board 118.

Switch 100 further comprises a plurality of spine boards 112, which each has a respective spine switch (not shown) which inter-connects a plurality of spine ports 114. A backplane 130 formed of cables, connects each leaf switch 102 to each spine board 112. Optionally, each leaf switch 102 includes a number of internal ports 106 equal to the number of spine boards 112 and each spine board 112 has a number of spine ports 114 equal to the number of leaf switches 102. Alternatively, one or more, possibly all, of leaf switches 102 and/or spine boards 112 may have extra ports for redundancy.

In one non-limiting example, switch 100 includes 36 leaf switches 102, mounted on 18 switch boards 118. Each of leaf switches 102 has 18 internal ports 106, such that switch 100 includes 648 internal ports 106. Switch 100 includes 18 spine boards 112, each of which includes 36 spine ports 114, such that together switch 100 includes 648 internal ports 106. It is noted that switch 100 may be designed for other, larger or smaller, numbers of boards, leaf switches and ports.

Switch Frame Structure

Figure 2:
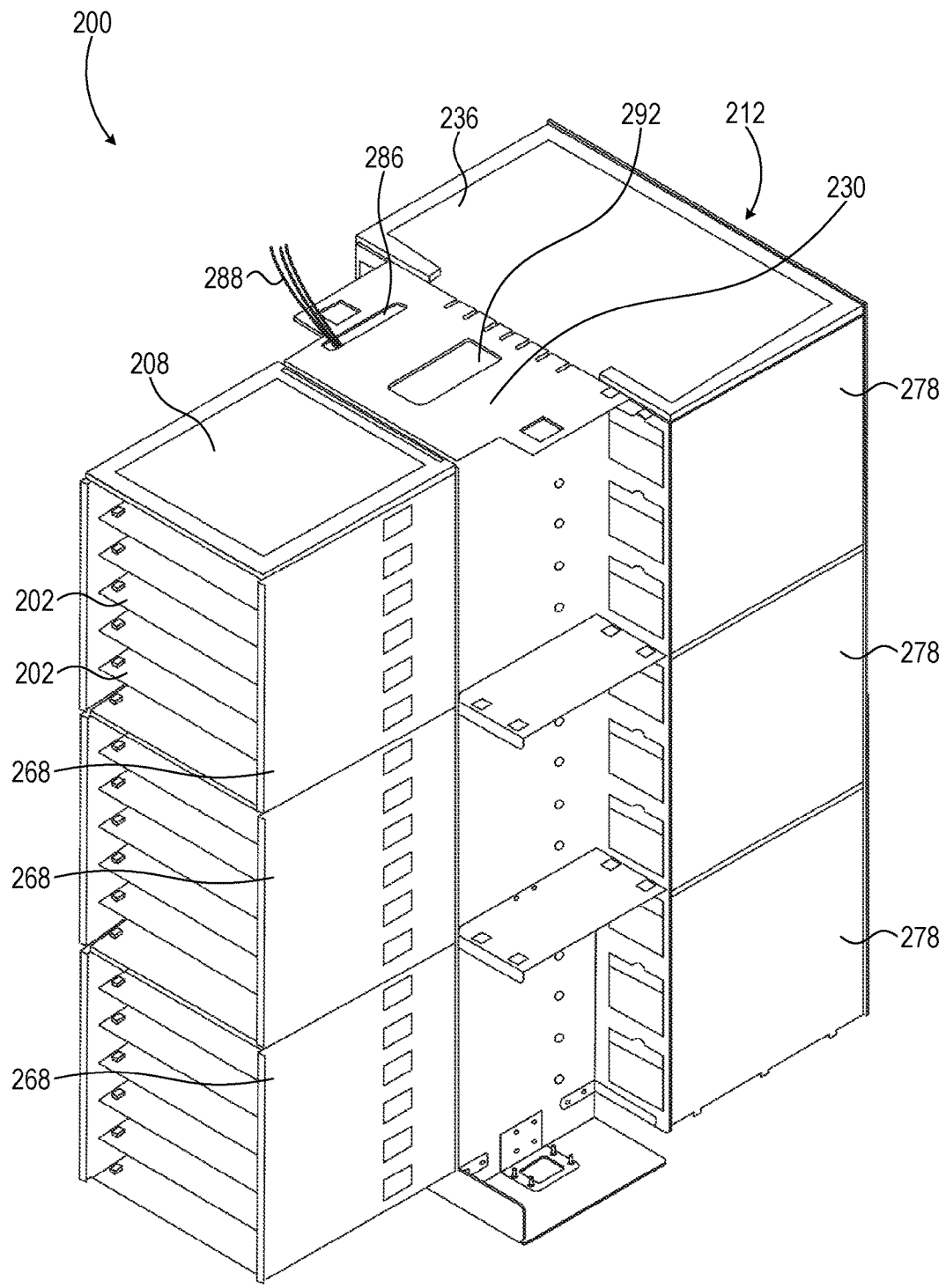
FIG. 2 is a schematic view of a director-class switch, in accordance with an embodiment of the invention.

FIG. 2 is a schematic view of a main unit chassis 200 of director-class switch 100 (FIG. 1), in accordance with an embodiment of the invention. Main unit chassis 200 comprises a central backplane cage 230, a spine basket unit 208 and a leaf basket unit 236. Spine basket unit 208 includes a plurality of spine slots 202 for receiving spine boards 112 (FIG. 1). Leaf basket unit 236 includes a plurality of leaf slots 212, for receiving leaf boards 118 (FIG. 1). Optionally, spine basket unit 208 is formed of a plurality of sub units 268, which are separately attached to backplane cage 230. Alternatively or additionally, leaf basket unit 236 is formed of a plurality of sub units 278, which are separately attached to backplane cage 230.

Backplane cage 230 hosts backplane 130 (FIG. 1), as detailed hereinbelow. In some embodiments of the invention, power cables 288 enter backplane cage 230 through a power slot 286. A top window 292 of backplane cage 230 is optionally used to pass control wires to the leaf and/or spine boards.

Cage

Figure 3:
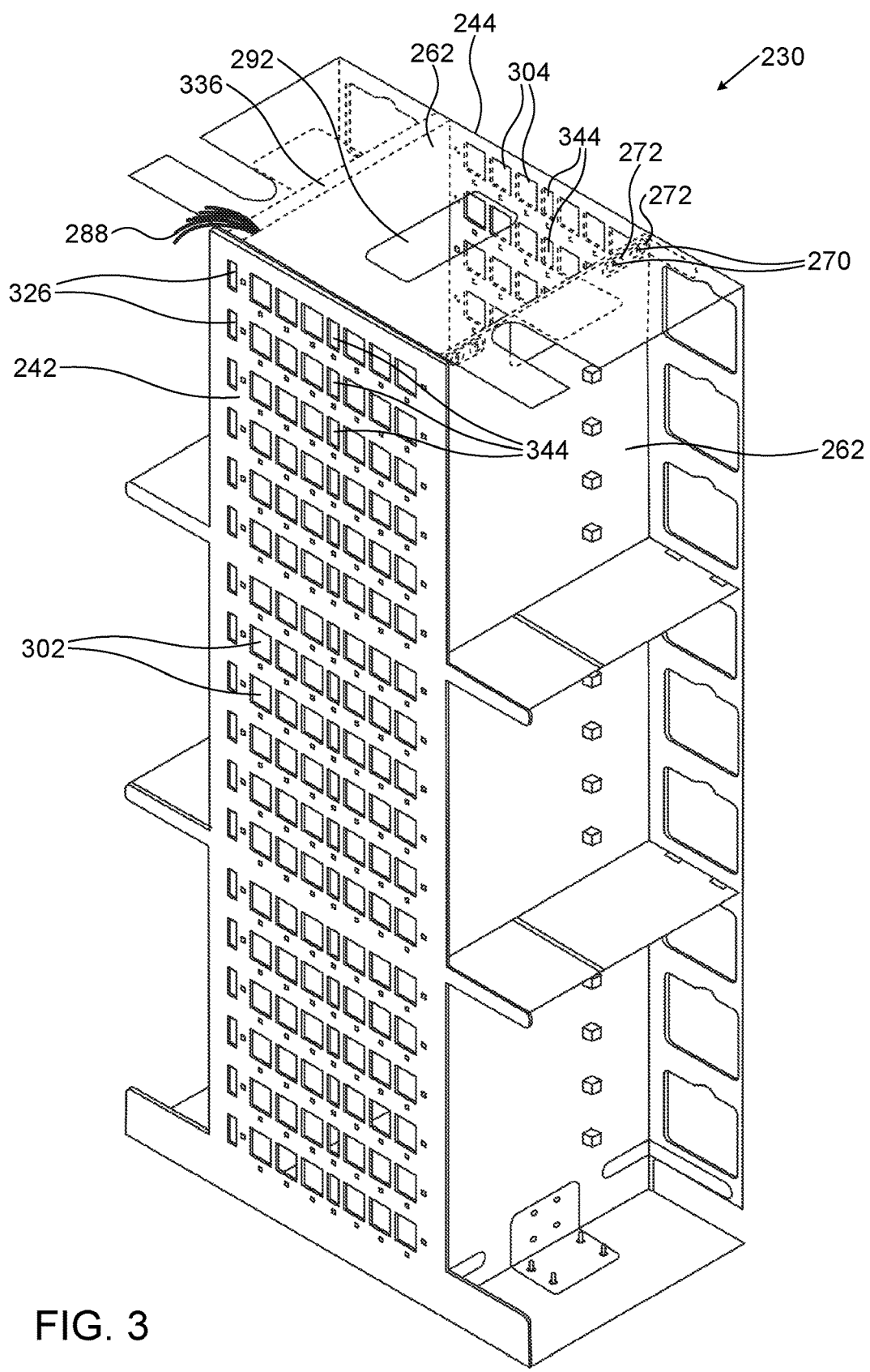
FIG. 3 is a view of a backplane cage of a director-class switch, in accordance with an embodiment of the invention.

FIG. 3 is a view of backplane cage 230, in accordance with an embodiment of the invention. A first wall 242 of cage 230 serves as a back wall of spine slots 202 (FIG. 2) and a second wall 244 of cage 230 serves as a back wall of leaf slots 212 (FIG. 2). First wall 242 and second wall 244 optionally each include a plurality of windows 302 and 304, through which spine boards 112 (FIG. 1) and leaf boards 118 (FIG. 1) connect to interface port units of backplane 130, as described hereinbelow. Cage 230 further includes side walls 262, which connect first and second walls 242 and 244.

In some embodiments, cage 230 defines a narrow compartment 336 through which power cables 288 connect to power sockets 326 that provide power to leaf boards 118 and/or to power sockets on wall 244 that provide power to spine boards 112. Alternatively to passing the power cables in a separate compartment 336, the power cables pass in a main interior of cage 230 along with the other wires forming backplane 130. The power connections are optionally passed over cables, similar to those used for backplane 130, in order to minimize mechanical constraints on director-class switch 100. Alternatively, the power connections pass on a printed circuit board (PCB).

Walls 242 and/or 244 optionally define for each spine board 112 and/or leaf board 118, a respective control window 344 through which a controller of the board (not shown) is connected to a control interface 444 (FIG. 8), which in turn connects to control wires (not shown) passing through window 292. The control wires are optionally used to exchange control signals between the boards and a controller (not shown) of director-class switch 100.

In some embodiments of the invention, one or more of walls 242 and 244 is formed of a plurality of separate units, connected to each other in a manner allowing additional leeway in connecting the boards 112 and/or 118 to the walls 242 and/or 244. Cage 230 is optionally made of a durable material, such as aluminum or steel, which can withhold the pressures of boards being inserted into slots 202 and 212.

In some embodiments of the invention, the internal ports 106 of each leaf switch 102 (FIG. 1) are divided into groups which connect to the wires of backplane 130 through separate windows 304. For example, the internal ports 106 of each leaf switch 102 are optionally grouped into three groups of six ports each, and each group connects to a respective leaf interface port unit 248 (FIG. 4) of the backplane. Similarly, the spine ports 114 of each spine board 112 (FIG. 1) are optionally divided into groups which connect to the wires of backplane 130 through separate windows 302. For example, the spine ports 114 of each spine board 112 are optionally grouped into six groups of six ports each, and each group connects to a respective spine interface port unit 246 (FIG. 4) of the backplane.

It is noted that instead of side walls 262, cage 230 may include side bars or other suitable connectors which connect walls 242 and 244.

Harnesses

Figure 4:
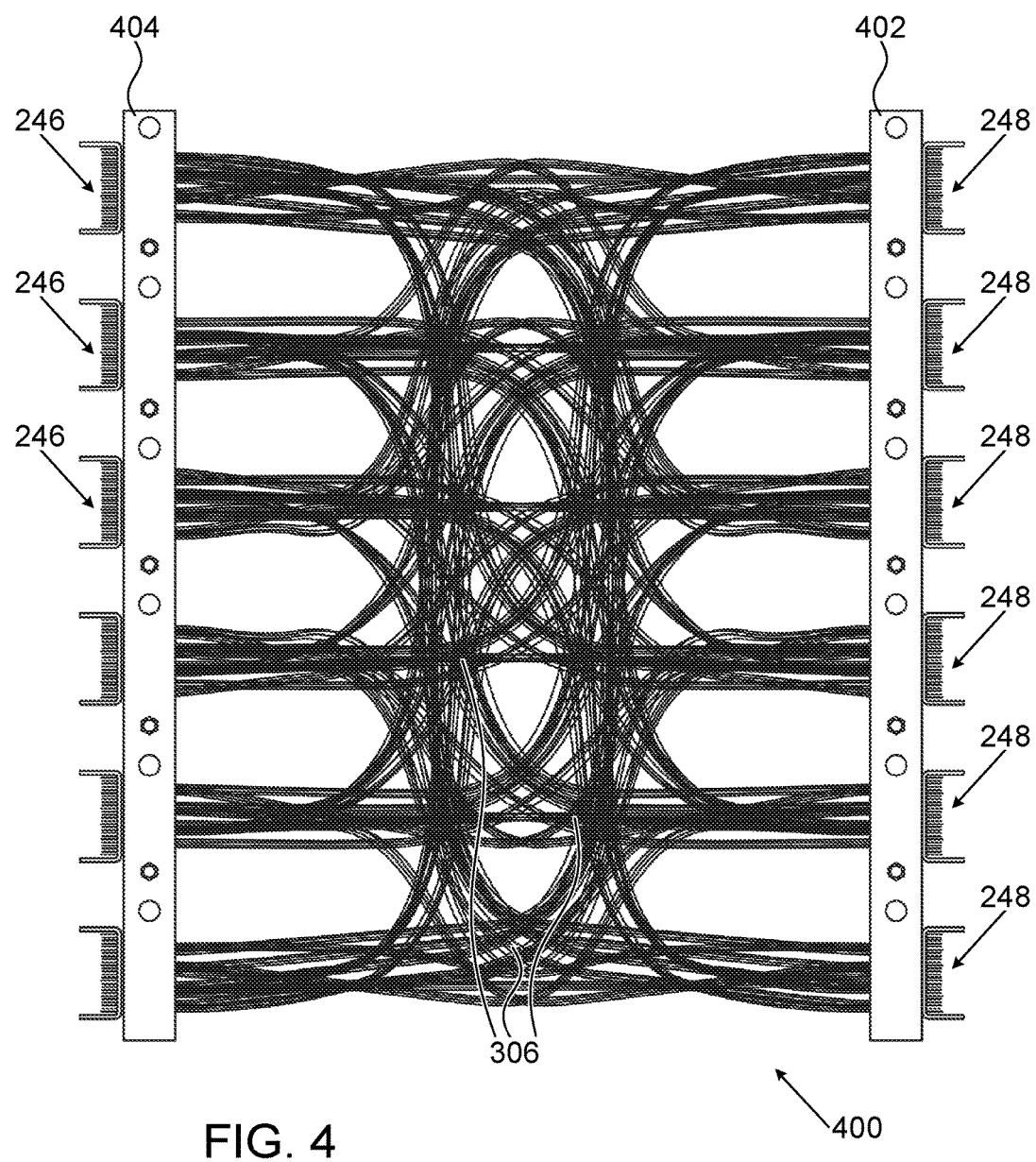
FIG. 4 shows a harness used as a building block of a backplane of a director-class switch, in accordance with an embodiment of the invention.

In accordance with embodiments of the invention, the wires of backplane 130 are constructed in separate modular harnesses, each of which connects a plurality of leaf interface port units 248 to a plurality of spine interface port units 246 (FIG. 4). The use of separate harnesses to form the wire backplane 130 makes the construction of the backplane much simpler in a manner which reduces the chances of mistakes, makes the assembly of the director-class switch simpler and allows easier replacement of parts in case of a failure.

FIG. 4 shows a harness 400, in accordance with an embodiment of the invention.

Figure 5:
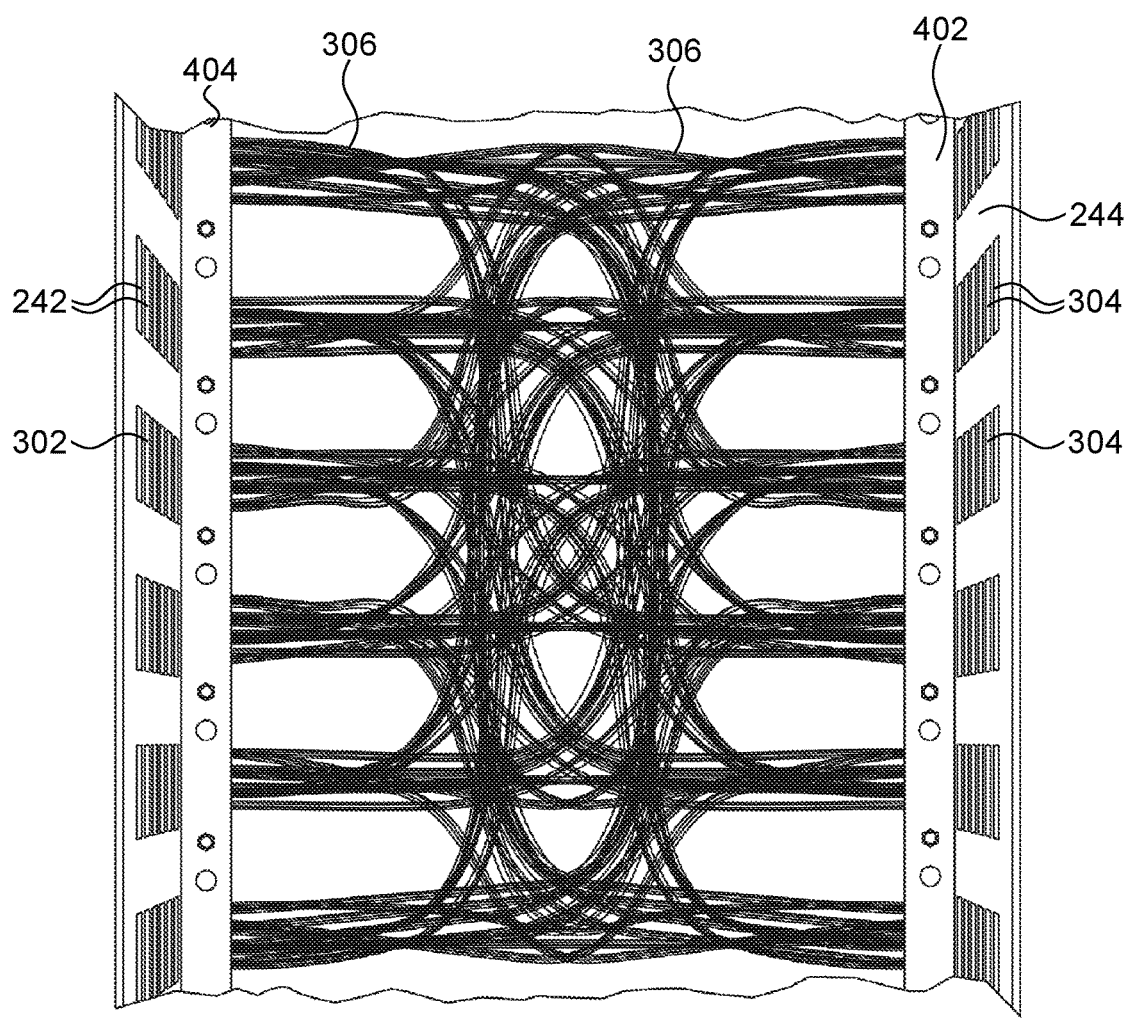
FIG. 5 is a schematic view of a harness within a backplane cage, in accordance with an embodiment of the invention.

FIG. 5 is a schematic view of a harness 400 within cage 230, in accordance with an embodiment of the invention. FIG. 5 shows the contents of cage 230 after a single harness 400 is mounted within cage 230.

Harness 400 comprises a plurality (e.g., six) of leaf interface port units 248, to be mounted in respective windows 304 (FIG. 3), for connecting to a plurality of respective leaf boards 102 (FIG. 1).

The leaf interface port units 248 are included together in a cartridge 402 (e.g., a rod), allowing simple mounting thereof on wall 244 (FIG. 3). A second cartridge 404 includes a plurality (e.g., six) of spine interface port units 246, for connecting to a plurality of spine boards 112 (FIG. 1). Harness 400 additionally includes cables 306, which connect each leaf interface port unit 248 in harness 400 to each of the spine interface port units 246 in harness 400.

The port connections of interface port units 246 and 248 are optionally mounted in the interface port units in a manner allowing them some leeway in movement, so as to allow adjustment to the ports of the boards to which they are connected.

Cartridges 402 and 404 are optionally made of a rigid material, for example a metal such as aluminum, iron or steel, in order to allow for durability and withstand the pressures of inserting boards 112 or 118. Cartridges 402 and 404 are optionally at least 605, at least 70% or even at least 80% metal. Alternatively, cartridges 402 and/or 404 comprise a plastic or other relatively elastic material which allows for resilience to misalignment of different cards 102 and/or 112.

Interface port units 246 and 248 are optionally mounted on their respective cartridges 404 and 402 in a manner keeping the relative locations of the interface port units on a single cartridge fixed. Alternatively, interface port units 246 and/or 248 are mounted on their cartridges in a manner leaving some leeway between the interface port units on a single cartridge. The leeway is optionally achieved by using a flexible material for cartridges 402 and/or 404 and/or by movably mounting the Interface port units 246 and 248 on their respective cartridges.

Harness 400 of FIG. 4 is for connecting leaf interface port units 248 and spine interface port units 246 of rows of the same height. The distance between cartridges 402 and 404 allowed by cables 306 is optionally about the distance between walls 242 and 244.

Figure 6:
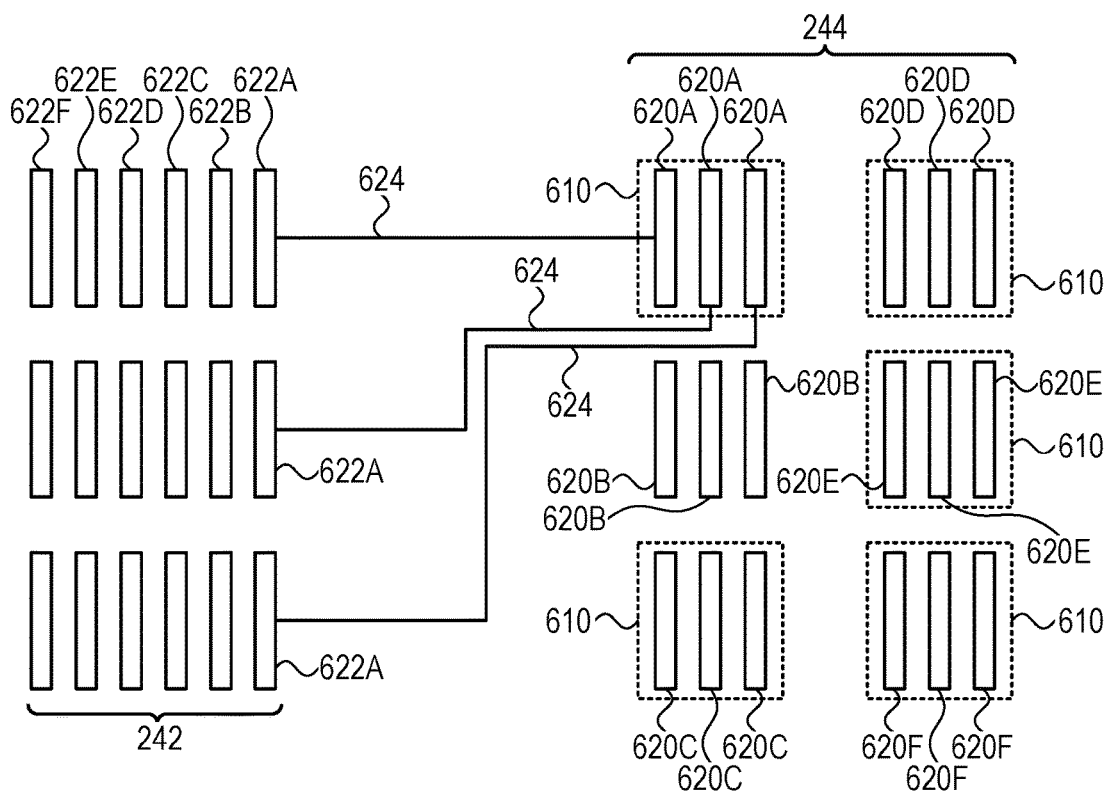
FIG. 6 is a diagram of the connections of a harness based backplane, in accordance with an embodiment of the invention.

FIG. 6 is a schematic spread-out diagram of the connections of backplane 130, between walls 242 and 244, in accordance with an embodiment of the invention.

Each group 610 of slots 304 (FIG. 3) for six leaf switches 102 is connected on wall 244 by three harnesses to all 18 slots of spine boards 112 on wall 242. Each harness is formed of a leaf cartridge 620 (marked 620A, 620B, 620C, . . . ), a spine cartridge 622 (marked 622A, 622B, 622C, . . . ) and cables 306 (FIG. 4), represented in FIG. 6 by a single line 624.

Different harnesses optionally include cables of different lengths, depending on the relative intended positions of cartridges 620 and 622 on walls 244 and 242, respectively. The three leaf cartridges 620A belong to three harnesses in which they connect to three respective spine cartridges 622A. Each of these three harnesses has cables of a different size. A first one of these harnesses connects a spine cartridge 622A and a leaf cartridge 620A at the same height. A second one of these harnesses connects a spine cartridge 622A and a leaf cartridge 620A six rows higher and one column aside, and optionally has cables sufficiently longer than the first harness to allow for passing these six additional rows and one column. A third one of these harnesses optionally connects a spine cartridge 622A and a leaf cartridge 620A twelve rows higher and two columns to the side, and optionally has cables sufficiently longer than the first harness to allow for passing these twelve additional rows and two columns to the side.

The three harnesses of cartridges 620B optionally include one which has cables for the same height and column as the middle row of cartridges 622B, one for six rows higher and one column to the side and one for six rows lower and one column to the side.

The three harnesses of cartridges 620C optionally include one which has cables for the same height and column as the bottom row of cartridges 622C, one for six rows higher and one column to the side and one for six rows lower and two columns to the side. The same harness lengths connecting cartridges 620A, 620B and 620C to cartridges 622A, 622B and 622C, respectively, are optionally used for the harnesses connecting cartridges 620D, 620E and 620F to cartridges 622D, 622E and 622F. Accordingly, in some embodiments, the 18 harnesses forming backplane 130 include harnesses of four different lengths:
1) same row and column;
2) six rows away and one column aside;
3) 12 rows away and two columns aside; and
4) six rows away and two columns aside.

It is noted, however, that other matchings of cartridges 620 and 622 may be used, for example having the harness of same row cartridges 620B and 622B be one or two columns aside, in which case more harness lengths are required. Further alternatively, a smaller number of harness lengths are used (e.g., three sizes, two sizes or only a single size), and, when necessary, a longer size than necessary is used at the cost of having slack wires within cage 230.

It is noted that in some embodiments, each leaf switch 102 and/or each spine board 112 connects to a plurality of interface port units (246 or 248), belonging to a plurality of different harnesses. In turn, the harnesses are each connected to a plurality of different boards (118 or 112) and/or leaf or spine switches. While such connection scheme places mechanical constraints on the harnesses and boards, the advantages of forming backplane 130 from prefabricated harnesses are considered in accordance with embodiments of the invention to outweigh any possible disadvantages of these constraints.

Figure 7:
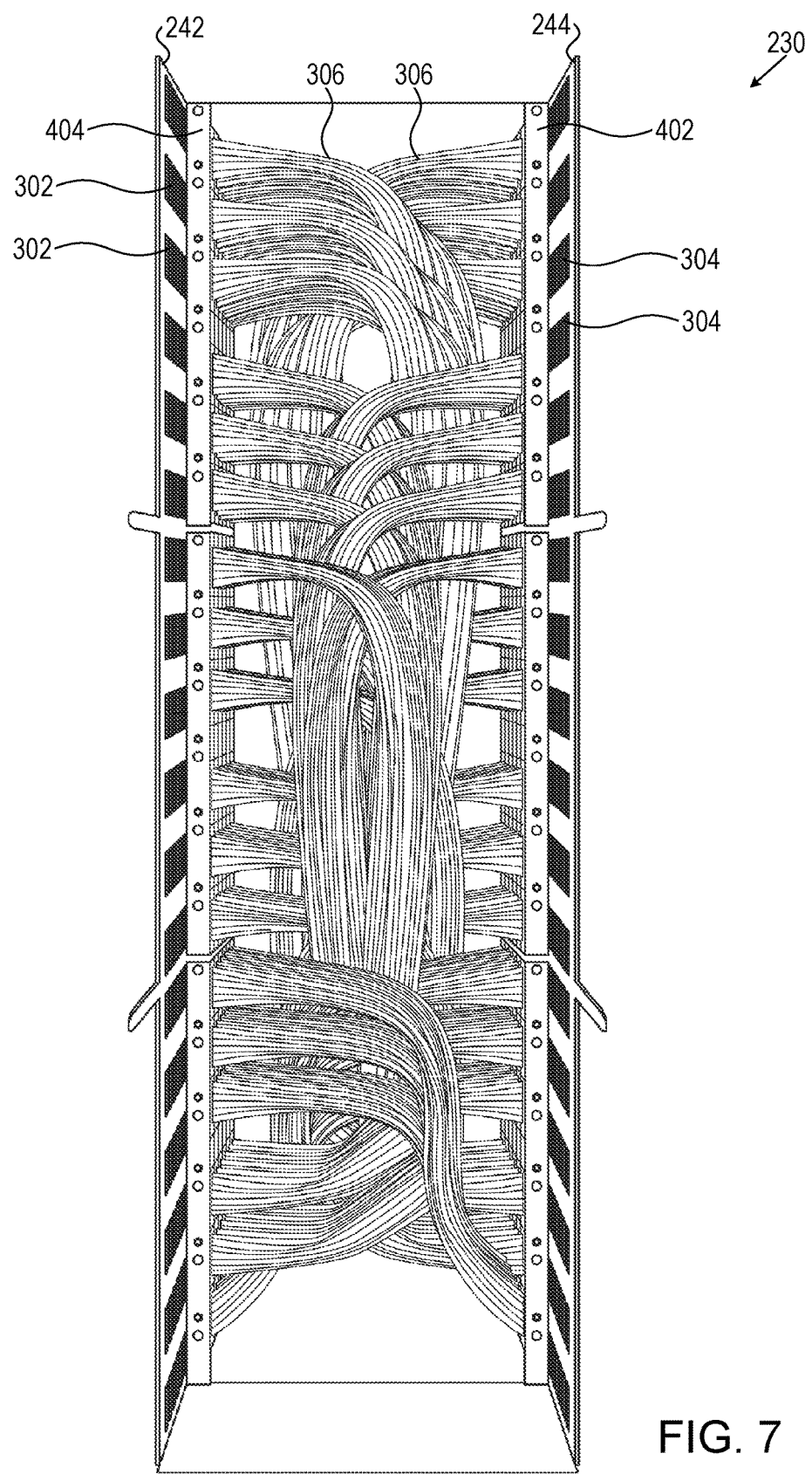
FIG. 7 is a schematic side view of a partial director-class switch backplane within a cage, in accordance with an embodiment of the invention.

FIG. 7 is a schematic side view of a portion of backplane 130 within cage 230, in accordance with an embodiment of the invention. FIG. 7 shows cage 230 after three columns of harnesses were mounted within cage 230, while some of windows 302 and 304 are bare as their corresponding harnesses have not been mounted yet.

Figure 8:
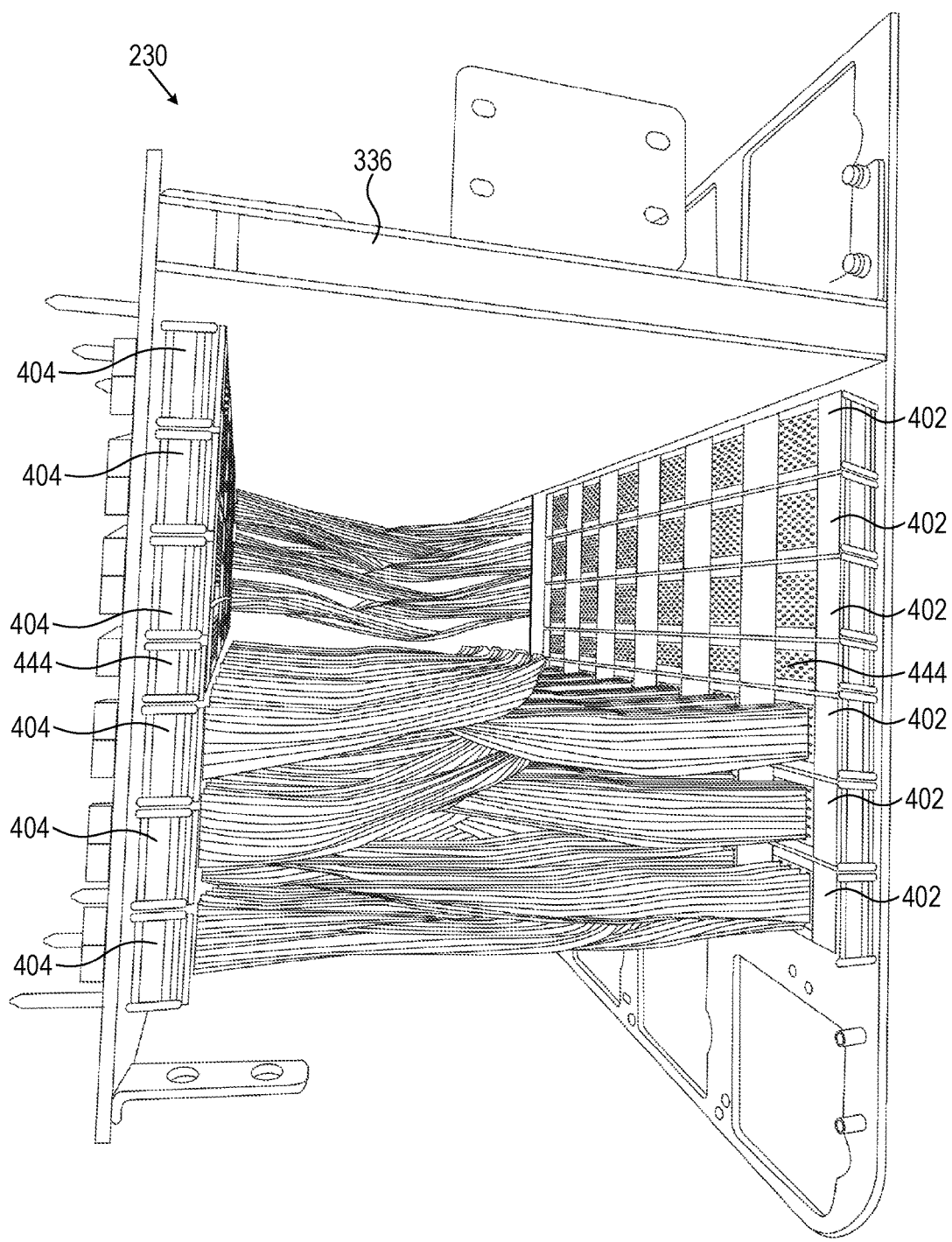
FIG. 8 is a schematic top view of a cage of a director-class switch backplane, with partial wiring of the backplane, in accordance with an embodiment of the invention.

FIG. 8 is a schematic top view of cage 230 with partial wiring of the backplane, in accordance with an embodiment of the invention. FIG. 8 shows wires connecting only some of cartridges 402 and 404 in order to avoid over crowding of the figure.

Construction

Figure 9:
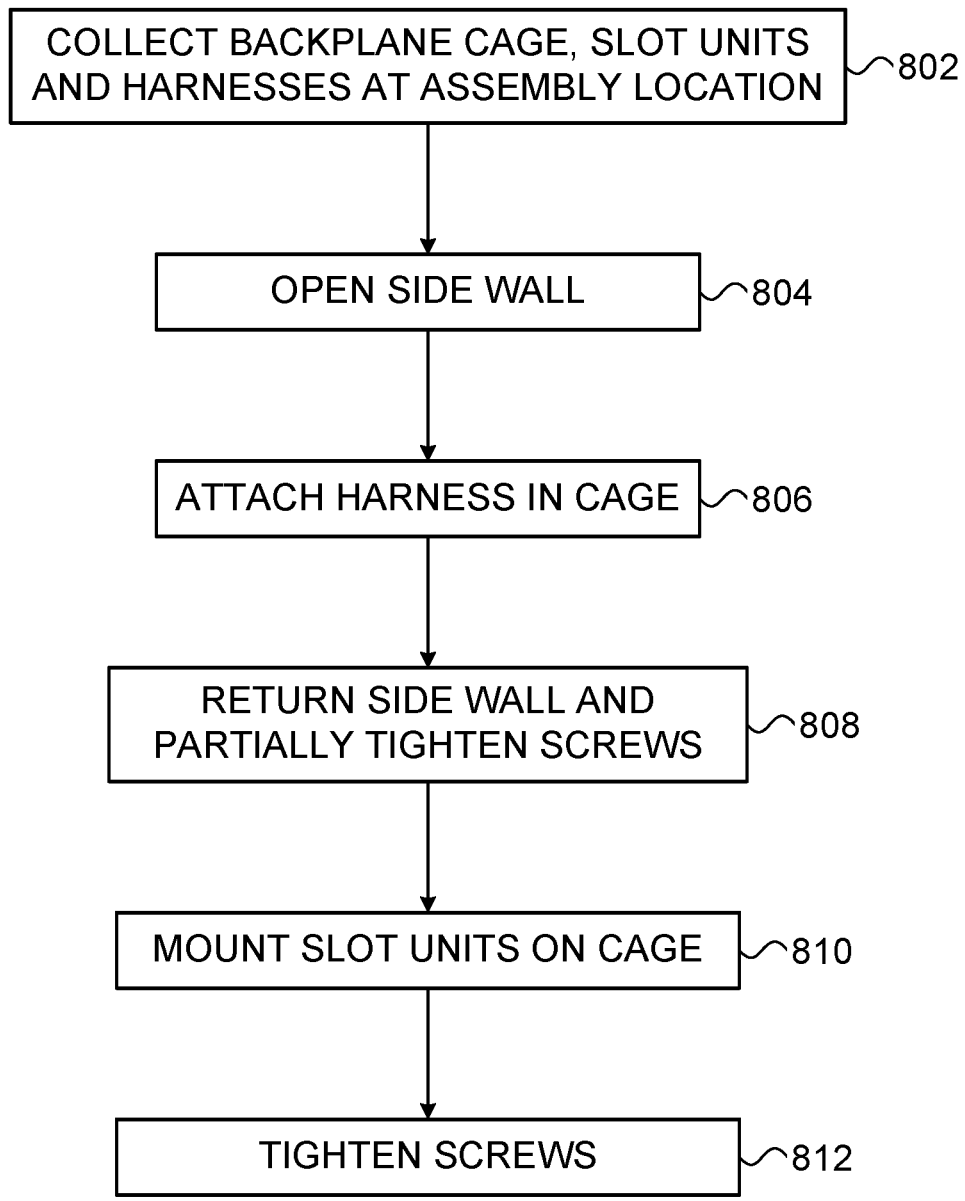
FIG. 9 is a flowchart of acts performed in assembling a director-class switch, in accordance with an embodiment of the invention.

FIG. 9 is a flowchart of a method of assembly of director-class switch 100, in accordance with an embodiment of the invention. Optionally, spine basket unit 208, cage 230, leaf basket unit 236 and harnesses 400 are manufactured separately and are collected (802) for assembly at an assembly location. In accordance with some embodiments of the present invention, side walls 262 are connected to walls 242 and 244 by screws 270 (FIG. 3) positioned in holes 272 which are larger than the cross-sections of the screws, optionally by at least 25%, 50% or even 100%. Optionally, when cage 230 is shipped to the assembly location, screws 270 are tightened such that side walls 262 are firmly attached to walls 242 and 244 without leeway, allowing safe shipment of cage 230.

In assembling director-class switch 100, screws 270 and walls 262 are opened (804) and the harnesses are attached (806) in their respective locations. Optionally, during the attachment (806), walls 242 and 244 are mounted to a jig and/or any other assembly fixture, which allows access to the interior of cage 230, while holding walls 242 and 244 in place.

FIG. 7 shows cage 230 after some of harnesses 400 were mounted therein, while side wall 262 is still open. Side walls 262 are returned (808) to their places and screws 270 are only partially tightened, in a manner allowing movement within their respective holes.

Spine basket unit 208 is mounted (810) on first wall 242 and leaf basket unit 236 is mounted (810) on second wall 244. The leeway between first wall 242 and second wall 244, due to screws 270 not being completely fastened, ensures that the mounting of spine basket unit 208 on first wall 242 does not affect the ability to properly align leaf basket unit 236 on second wall 244, or vice versa. Screws 270 are then optionally tightly fastened (812), to allow for durability of director-class switch 100 to movements and mounting of boards into the slots.

By constructing backplane 130 from harnesses 400, which are prepared in advance, the assembly process is simplified. The wire connections are performed outside of cage 230 which allows better work conditions.

It is noted that the assembly acts in FIG. 9 may be performed in other orders. For example, spine basket unit 208 and/or leaf basket unit 236 may be mounted on cage 230 before the mounting of some or all of harnesses 400 within the cage.

Alternatives

As shown in FIG. 2, leaf slots 212 are arranged one in a row. In other embodiments, multiple leaf slots are located on each row.

In the above description, each leaf board 118 is assumed to carry two leaf switches 102. In other embodiments, each leaf switch 102 may be on a separate board or three or more switches may be mounted on a single board. In some embodiments, different boards may carry different numbers of switches. Accordingly in these embodiments, different slots have sizes for accommodating the boards they are intended to receive.

While the above description relates to a two-sided director-class switch in which spine boards 112 are mounted in slots on wall 242 which is opposite wall 244 against which leaf boards 102 are mounted, the principles discussed above may be used in other director-class switch layouts. For example, stand-alone harnesses may be used to connect board slots in a one sided switch, in which the spine boards 112 are mounted on the lower (or upper) half and the leaf boards are mounted on the upper (or lower) half. In this arrangement, the harnesses optionally include longer cables to allow the connection between the upper and lower halves. In other example embodiments, a three or four sided director-class switch is used, and the harnesses connect the spine board slots to the leaf board slots.

Furthermore, the term director-class switch is used herein to refer to switches that have a relatively high port count, which benefits from being constructed from modular harnesses. These director-class switches may include more than 128 ports, more than 512 ports or even more than 1024 ports. It is noted, however, that in some case embodiments of the invention may be implemented on relatively small director-class switches, including for example less than 512 ports, less than 256 ports or even less than 128 ports.

While in the above description each leaf switch matches three interface units 248, and each cartridge 402 includes six interface port units 248, other numbers and arrangements may be used in accordance with the present invention. For example, each leaf board 102 may be designed to match only two interface port units of nine ports each, and the cartridges each include nine such interface units.

The number of internal ports 106 corresponding to a single leaf interface port unit 248 is optionally selected in a manner which reduces the number of port units 248 in a suitable manner, without making the cartridges too large.

It will be appreciated that the embodiments described above are cited by way of example, and that the present disclosure is not limited to what has been particularly shown and described hereinabove. Rather, the scope of the present disclosure includes both combinations and sub-combina-

The invention claimed is:

1. A main unit of a director-class switch, comprising:
   a chassis;
   a plurality of slots on the chassis configured to receive switch boards; and
   a plurality of harnesses, each harness comprising:
      first and second rods;
      a plurality of interface port units mounted on each of the first and second rods; and
      cables connecting each of the interface port units of the first rod to each of the interface port units of the second rod,
   wherein the entire harnesses including the rods and the connecting cables are mounted in the chassis such that:
      the interface port units face ends of the slots in a manner configured to mate with corresponding connectors of switch boards inserted into the slots,
      at least two of the plurality of interface port units are mounted in each slot, and
      at least two of the interface port units of each rod are located in different slots.

2. The main unit of claim 1, wherein the plurality of slots are located on first and second opposite walls of the chassis.

3. The main unit of claim 2, wherein the slots located on the first wall are configured to receive boards of a single type.

4. The main unit of claim 3, wherein the slots located on the first wall are configured to receive a different type of boards from the slots located on the second wall.

5. The main unit of claim 2, wherein the first and second opposite walls of the chassis are connected by screws located in holes at least 50% larger than the cross-sections of the screws.

6. The main unit of claim 1, wherein each slot includes a plurality of interface port units of different harnesses.

7. The main unit of claim 1, wherein the plurality of harnesses include a first harness having cables of a first set of lengths and a second harness having cables of a second set of lengths different from the first set of lengths, allowing for different maximal distances between the rods of the first and second harnesses.

8. The main unit of claim 1, comprising a printed circuit board serving as a connection between a power source of the director-class switch and power sockets in each of the slots.

9. The main unit of claim 1, comprising power cables connecting a power source of the director-class switch to power sockets in each of the slots.

10. The main unit of claim 1, wherein the first and second rods comprise metal rods.

11. The method of claim 1, wherein the first and second rods comprise rigid bars.

12. The method of claim 1, wherein the plurality of harnesses includes a first harness whose first and second rods are mounted in the chassis at a same height, and a second harness whose first and second rods are mounted in the chassis at different heights.

13. The method of claim 1, wherein the plurality of harnesses includes a first harness mounted in the chassis with a first height difference between the first and second rods of the first harness, and a second harness mounted in the chassis with a second height difference between the first and second rods of the second harness, wherein the second height difference is different from the first height difference.

14. A method of constructing a main unit of a director-class switch, comprising:
   providing a chassis including a plurality of slots on the chassis configured to receive switch boards;
   providing a plurality of harnesses, each harness comprising:
      first and second rods;
      a plurality of interface port units mounted on each of the first and second rods; and
      cables connecting each of the interface port units of the first rod to each of the interface port units of the second rod,
   mounting the harnesses in the chassis such that the interface port units face ends of the slots in a manner configured to mate with corresponding connectors of switch boards inserted into the slots,
   wherein at least two of the plurality of interface port units are mounted in each slot, and at least two of the interface port units of each rod are located in different slots.

15. The method of claim 14, wherein providing the chassis comprises providing a chassis with walls connected to each other in a manner allowing limited relative movement.

16. The method of claim 15, comprising strengthening a connection between the walls, limiting the possibility of relative movement of the walls, after mounting the harnesses in the chassis.

17. The method of claim 14, wherein the plurality of harnesses includes harnesses having different cables of different lengths allowing for different maximal distances between the rods of the harness.

18. The method of claim 14, wherein the harnesses all include the same number of interface port units.

19. The method of claim 14, wherein each of the rods of the harnesses comprises at least four interface port units.

* * * * *